(12) United States Patent
Yamazaki

(10) Patent No.: US 11,524,321 B2
(45) Date of Patent: Dec. 13, 2022

(54) CLEANING METHOD AND PLASMA PROCESSING APPARATUS

(71) Applicant: TOKYO ELECTRON LIMITED, Tokyo (JP)

(72) Inventor: Masahiro Yamazaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 173 days.

(21) Appl. No.: 16/919,714

(22) Filed: Jul. 2, 2020

(65) Prior Publication Data

US 2021/0001383 A1 Jan. 7, 2021

(30) Foreign Application Priority Data

Jul. 5, 2019 (JP) .............................. JP2019-126423

(51) Int. Cl.
| | |
|---|---|
| *B08B 7/00* | (2006.01) |
| *H01L 21/67* | (2006.01) |
| *B08B 9/08* | (2006.01) |
| *B08B 5/00* | (2006.01) |
| *H01J 37/32* | (2006.01) |

(52) U.S. Cl.
CPC .............. *B08B 7/0057* (2013.01); *B08B 5/00* (2013.01); *B08B 9/08* (2013.01); *H01J 37/3244* (2013.01); *H01J 37/32862* (2013.01); *H01L 21/67069* (2013.01); *H01J 2237/335* (2013.01)

(58) Field of Classification Search
None
See application file for complete search history.

(56) References Cited

U.S. PATENT DOCUMENTS

2016/0293384 A1* 10/2016 Yan .................. H01L 21/02068

FOREIGN PATENT DOCUMENTS

JP 2014204001 A 10/2014

* cited by examiner

*Primary Examiner* — Mikhail Kornakov
*Assistant Examiner* — Ryan L Coleman
(74) *Attorney, Agent, or Firm* — Weihrouch IP

(57) ABSTRACT

A cleaning method is provided. In the cleaning method, residues of elements of a group for a common semiconductor material in a chamber are removed with plasma of a halogen-containing gas. Residues of metal elements of groups 12 and 13 and groups 14 and 15 in the chamber are removed with plasma of a hydrocarbon-containing gas. A C-containing material in the chamber is removed with plasma of an O-containing gas. Further, the removing with the plasma of the halogen-containing gas, the removing with the plasma of the hydrocarbon-containing gas, and the removing with the plasma of the O-containing gas are performed in that order or the removing with the plasma of the hydrocarbon-containing gas, the removing with the plasma of the O-containing gas, and the removing with the plasma of the halogen-containing gas are performed in that order X times where X≥1.

9 Claims, 15 Drawing Sheets

FIG.5

| H | | | | | | | | | | | | | | | | | | He |
|---|---|---|---|---|---|---|---|---|---|---|---|---|---|---|---|---|---|---|
| Li | Be | | | | | | | | | | | B | C | N | O | F | Ne |
| Na | Mg | | | | | | | | | | | Al | Si | P | S | Cl | Ar |
| K | Ca | Sc | Ti | V | Cr | Mn | Fe | Co | Ni | Cu | Zn | Ga | Ge | As | Se | Br | Kr |
| Rb | Sr | Y | Zr | Nb | Mo | Tc | Ru | Rh | Pd | Ag | Cd | In | Sn | Sb | Te | I | Xe |
| Cs | Ba | * | Hf | Ta | W | Re | Os | Ir | Pt | Au | Hg | Tl | Pb | Bi | Po | At | Rn |
| Fr | Ra | ** | Rf | Db | Sg | Bh | Hs | Mt | Ds | Rg | | | | | | | |

——— ELEMENTS OF GROUP FOR COMMON SEMICONDUCTOR MATERIAL (GROUP A)

—·—·— METAL ELEMENTS OF GROUPS 12 AND 13 (GROUP B)

– – – METAL ELEMENTS OF GROUPS 14 AND 15 (GROUP C)

······ HALOGENS, NOBLE GAS, etc. (GROUP D)

FIG. 6A

| Fluorides | | BF3 | CF4 | NF3 | GROUP A |
|---|---|---|---|---|---|
| | | -100 | -128 | -128 | |
| | AlF3 | GaF3 | GeF4 | PF3 | SF6 |
| | 1276 | >1000 | -36 | -101 | -63 |
| ZnF2 | | | | | |
| 1500 | | | | | |
| CdF2 | InF3 | SnF4 | AsF5 | SeF6 | |
| 1750 | >1200 | 705 | -53 | -46 | |
| HgF2 | TlF | PbF2 | SbF5 | TeF6 | |
| - | 826 | 1293 | 141 | -38 | |
| | | | BiF5 | PoF | |
| | | | 230 | N/D | |

GROUP B     GROUP C

FIG. 6B

| Chlorides | | BCl3 | CCl4 | NCl3 | GROUP A |
|---|---|---|---|---|---|
| | | 12.5 | 77 | 71 | |
| | AlCl3 | SiCl4 | PCl3 | S | |
| | 190 | 58 | 76 | | |
| ZnCl2 | GaCl3 | GeCl4 | AsCl3 | Se | |
| 732 | 201 | 87 | 130 | | |
| CdCl2 | InCl | SnCl4 | SbCl5 | Te | |
| 964 | 608 | 115 | 140 | | |
| HgCl2 | TlCl | PbCl4 | BiCl3 | | |
| 304 | 720 | 50 | 441 | | |

GROUP B     GROUP C

FIG. 6C

| Bromides | | BBr3 | CBr4 | NBr3 | GROUP A |
|---|---|---|---|---|---|
| | | 91.3 | 190 | - | |
| | AlBr3 | SiBr4 | PBr3 | S | |
| | 255 | 154 | 174 | | |
| ZnBr2 | GaBr3 | GeBr4 | AsBr3 | Se | |
| 670 | 279 | 187 | 221 | | |
| CdBr2 | InBr | SnBr4 | SbBr3 | Te | |
| 863 | 656 | 205 | 288 | | |
| HgBr2 | TlBr | PbBr2 | BiBr3 | | |
| 318 | 819 | 392 | 462 | | |

GROUP B     GROUP C

FIG. 6D

| Iodides | | BI3 | CI4 | NI3 | GROUP A |
|---|---|---|---|---|---|
| | | 210 | - | - | |
| | AlI3 | SiI4 | PI3 | S | 227 |
| | 382 | 288 | | | |
| ZnI2 | GaI3 | GeI4 | AsI3 | Se | 424 |
| 625 | 340 | 348 | | | |
| CdI2 | InI | SnI4 | SbI3 | Te | 400 |
| 744 | 712 | 365 | | | |
| HgI2 | TlI | PbI2 | BiI3 | | 542 |
| 351 | 824 | 872 | | | |

GROUP B     GROUP C

FIG. 7A

Hydrides

| | | | |
|---|---|---|---|
| ZnH2 — | AlH3 — | GeH4 −88 | SbH3 −17 |
| CdH2 — | GaH3 0 | SnH4 −51 | BiH3 17 |
| HgH2 — | InH3 −90 | PbH4 −13 | |
| | TlH3 — | | |

GROUP C (GeH4/SnH4/PbH4, SbH3/BiH3)

FIG. 7B

Methylates

| | | | |
|---|---|---|---|
| Zn(CH3)2 46 | Al(CH3)3 130 | Ge(CH3)4 44 | As(CH3)3 56 |
| Cd(CH3)2 106 | Ga(CH3)3 56 | Sn(CH3)4 76 | Sb(CH3)3 81 |
| Hg(CH3)2 93 | In(CH3)3 134 | Pb(CH3)4 — | Bi(CH3)3 110 |
| | Tl(CH3)3 110 | | |

GROUP B (Al/Ga/In/Tl methylates); GROUP C (Ge/Sn/Pb and As/Sb/Bi methylates)

CLEANING METHOD AND PLASMA PROCESSING APPARATUS

CROSS-REFERENCE TO RELATED APPLICATIONS

This application claims priority to Japanese Patent Application No. 2019-126423, filed on Jul. 5, 2019, the entire contents of which are incorporated herein by reference.

TECHNICAL FIELD

The present disclosure relates to a cleaning method and a plasma processing apparatus.

BACKGROUND

For example, Japanese Patent Application Publication No. 2014-204001 proposes a cleaning method capable of removing a Ti-containing film in a chamber 11. In Japanese Patent Application Publication No. 2014-204001, a carbon-containing film and the Ti-containing film are adhered to a member in the chamber 11, and a surface of the Ti-containing film is modified while the carbon-containing film is removed with plasma of an oxygen-containing gas. A TiO film obtained by modifying the surface of the Ti-containing film is removed with plasma of a fluorine-containing gas. The residue of the Ti-containing film exposed by removing the TiO film is removed from the member with plasma of a chlorine-containing gas.

However, when a deposit adhered to an inner wall of the chamber includes an organic substance and a silicon material in addition to a metal element such as indium that is difficult to etch, it is necessary to clean the inner wall of the chamber 11 with a gas or a cleaning method suitable for each residue. Otherwise, each residue is accumulated on the inner wall of the chamber 11. As a result, particles may be generated in the chamber 11 or process reproducibility may deteriorate.

The present disclosure provides a cleaning method and a plasma processing apparatus capable of effectively removing the elements of groups 12 to 16 in a chamber.

SUMMARY

In accordance with an aspect of the present disclosure, there is provided a cleaning method including: removing residues of elements of a group for a common semiconductor material in a chamber with plasma of a halogen-containing gas; removing residues of metal elements of groups 12 and 13 and residues of metal elements of groups 14 and 15 in the chamber with plasma of a hydrocarbon-containing gas; and removing a C-containing material in the chamber with plasma of an O-containing gas. The removing with the plasma of the halogen-containing gas, the removing with the plasma of the hydrocarbon-containing gas, and the removing with the plasma of the O-containing gas are performed in that order X times, where X is a natural number greater than or equal to 1, or the removing with the plasma of the hydrocarbon-containing gas, the removing with the plasma of the O-containing gas, and the removing with the plasma of the halogen-containing gas are performed in that order X times.

BRIEF DESCRIPTION OF THE DRAWINGS

The objects and features of the present disclosure will become apparent from the following description of embodiments, given in conjunction with the accompanying drawings, in which:

FIG. 5 shows a group A, a group B, and a group C in a periodic table.

FIGS. 6A to 6D show boiling points of halides of the group A, the group B, and the group C according to one embodiment.

FIGS. 7A and 7B show boiling points of hydrides of the group C and boiling points of methylates of the groups B and C according to one embodiment.

DETAILED DESCRIPTION

Figure 1:
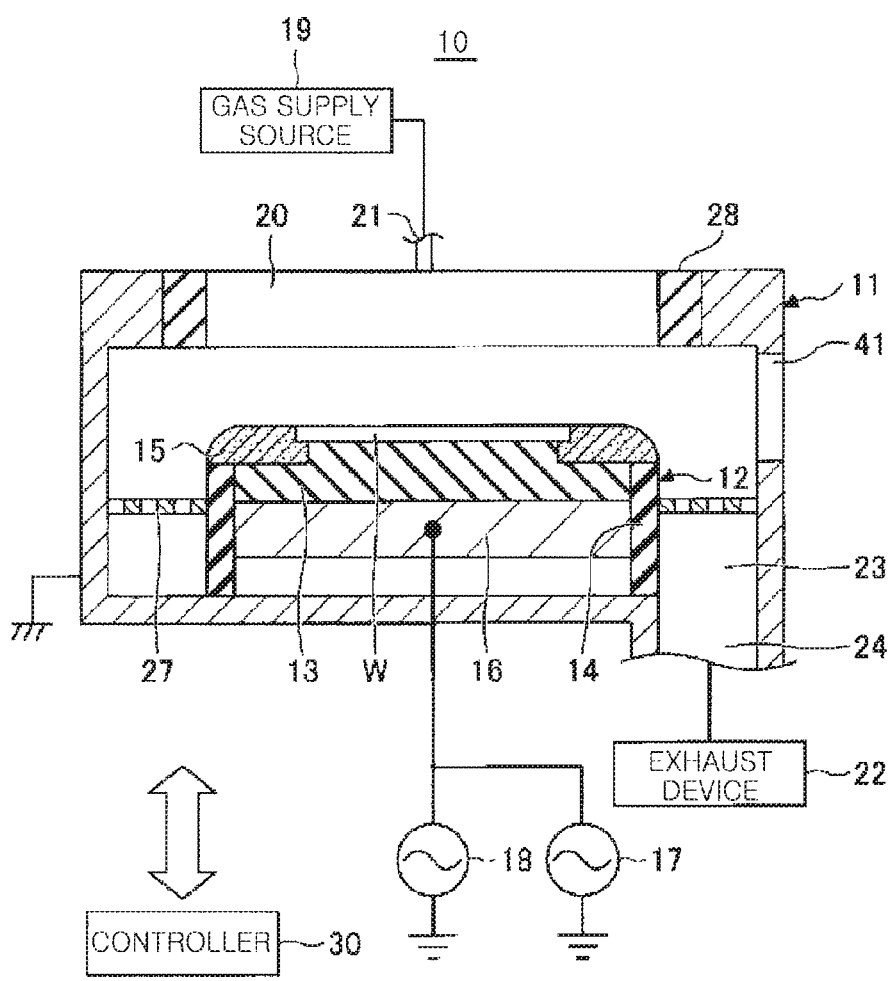
FIG. 1 is a schematic cross-sectional view showing an example of a plasma processing apparatus according to one embodiment.

Hereinafter, embodiments of the present disclosure will be described in detail with reference to the accompanying drawings. Like reference numerals will be given to like parts having substantially the same functions and configurations throughout this specification and the drawings, and redundant description thereof will be omitted.

<Plasma Processing Apparatus>

First, a plasma processing apparatus according to an embodiment will be described with reference to FIG. 1. FIG. 1 is a schematic cross-sectional view showing an example of a plasma processing apparatus 10 according to the embodiment. The plasma processing apparatus 10 is an example of a plasma processing apparatus that is configured to perform a cleaning method according to the embodiment.

The plasma processing apparatus 10 includes a chamber 11 and a substrate support 12 disposed in the chamber 11. The chamber 11 is frame-grounded. The substrate support 12 includes an electrostatic chuck 13 and a base 16. The base supports the electrostatic chuck 13. The substrate support 12 is disposed at a bottom portion of the chamber 11 via a support portion 14 that is an insulating member.

The base 16 is made of a metal such as aluminum. The electrostatic chuck 13 is made of a dielectric material such as alumina ($Al_2O_3$). The electrostatic chuck 13 has a substantially circular shape in a plan view. The electrostatic chuck 13 holds a substrate W by an electrostatic attractive force generated by applying a DC voltage to an electrode (not shown). The substrate W is placed at the center of the electrostatic chuck 13, and an annular edge ring 15 (also referred to as "focus ring") is placed at an outer peripheral portion of the electrostatic chuck 13 to surround a periphery of the substrate W.

An annular exhaust passage 23 is formed between a side wall of the chamber 11 and a side wall of the substrate support 12 and is connected to an exhaust device 22 through an exhaust port 24. The exhaust device 22 includes a vacuum pump and exhausts a gas from the chamber 11 to reduce a pressure in a processing space in the chamber 11 to a desired vacuum level. The exhaust passage 23 is provided with a baffle plate 27 that divides an inner space of the chamber 11 into a processing space and an exhaust space and is configured to control a gas flow.

The substrate support 12 is connected to a first radio frequency power supply 17 and a second radio frequency power supply 18. The first radio frequency power supply 17 is configured to apply a source power having a frequency of, e.g., 40 MHz for plasma generation to the substrate support 12. The second radio frequency power supply 18 is configured to apply a bias power having a frequency of, e.g., 400 kHz for ion attraction to the substrate support 12. The first radio frequency power supply 17 may apply the source power for plasma generation to a shower head 20.

The shower head 20 is provided at an opening of a ceiling of the chamber 11 through a ring-shaped insulating member 28 provided at an outer peripheral portion of the shower head 20. A gas supply source 19 is configured to supply a gas depending on process conditions. The gas is introduced into the shower head 20 through a gas line 21 and is injected into the chamber 11 in a shower-like manner. The source power is capacitively applied to a space between the substrate support 12 and the shower head 20, and plasma is generated from the gas by the source power. The plasma processing apparatus 10 includes a controller 30. The controller 30 is configured to control an overall operation of the plasma processing apparatus 10.

When processing is performed in the plasma processing apparatus 10 configured as described above, a gate valve (not shown) is opened and the substrate W is loaded into the chamber 11 through a transfer port 41 while being held on a transfer arm. The substrate W is placed on the electrostatic chuck 13. The gate valve is closed after the substrate W is loaded.

A pressure inside the chamber 11 is reduced to a set value by the exhaust device 22, and the inside of the chamber 11 is controlled to be a vacuum state. A specific gas is introduced into the chamber 11 in a shower-like manner from the shower head 20 and the source power and the bias power are applied to the substrate support 12, thereby generating the plasma. Etching or the like is performed on a film on the substrate W by the generated plasma. After the etching is completed, the substrate W is held on the transfer arm and is transferred to the outside of the chamber 11.

<Film Structure and Product Processing Process>

Figure 2:
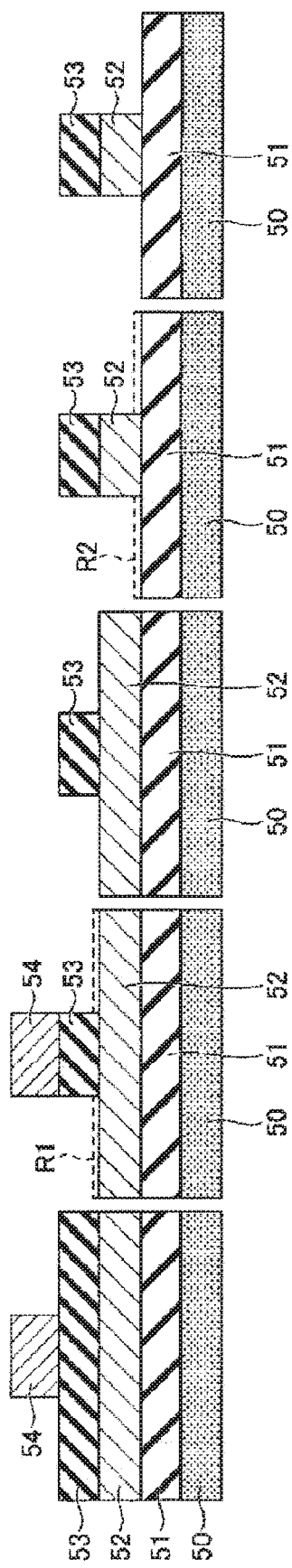
FIGS. 2A to 2E show a film structure according to one embodiment.
Figure 3:
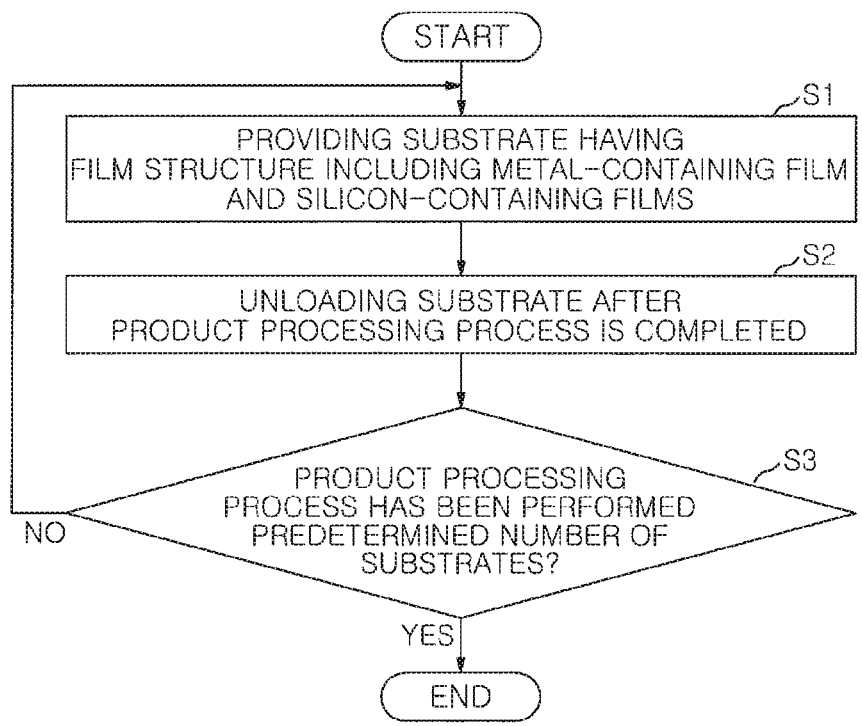
FIG. 3 is a flowchart showing a product processing process according to one embodiment.

Next, an example of a film structure on the substrate and a product processing process (including an etching process) performed on the substrate having the film structure will be described with reference to FIGS. 2A to 3. FIGS. 2A to 2E show a film structure according to one embodiment. FIG. 3 is a flowchart showing the product processing process according to one embodiment.

An initial state of the film structure on the substrate is shown in FIG. 2A. A silicon oxide film ($SiO_2$) 51, an indium tin oxide (ITO) film 52, a silicon oxide film 53, and an organic film 54 are stacked on a silicon substrate 50, in that order, from the bottom.

The silicon oxide films 51 and 53 may be silicon-containing films such as a silicon nitride (SiN) film and a silicon oxynitride (SiON) film. Instead of each of the silicon oxide films 51 and 53, one of a tungsten (W) film, a titanium (Ti) film, a titanium nitride (TiN) film, a tantalum (Ta) film, and a tantalum nitride (TaN) film may be stacked. The silicon oxide film 53 serves as a hard mask. Further, the silicon oxide film 53 may be omitted.

The ITO film 52 is an example of a metal-containing film. The ITO film 52 is not limited to an oxide of indium, and may be a film doped with another element as an impurity or a metal-containing film having another composition. For example, In—Ga—Zn—O or ZnO containing no In may be used. Further, a laminated structure of those films may be used. The organic film 54 is, for example, a photoresist and a circuit pattern is formed therein by a lithography process.

When the product processing process including the etching shown in FIG. 3 is started, first, the substrate (product substrate) having the film structure of FIG. 2A is provided on the substrate support 12 (step S1). The ITO film 52 is an example of a metal-containing film. The silicon oxide films 51 and 53 are examples of silicon-containing films. Then, the silicon oxide film 53 is first etched by plasma of a CF-based gas such as $CF_4$, and then the film structure adopts a state shown in FIG. 2B. A C-containing film (hereinafter, also referred to as "polymer") R1 produced from the CF-based gas during the etching may become a residue on the ITO film 52. Therefore, the polymer R1 and the organic film 54 are asked and removed with plasma of $O_2$ gas, and then the film structure adopts a state shown in FIG. 2C.

Next, the ITO film 52 is etched by plasma of a methane-based gas such as a $CH_4$ gas and $H_2$ gas, and then the film structure becomes a state shown in FIG. 2D. A polymer R2 produced from the methane-based gas during the etching becomes a residue on the silicon oxide film 51.

Therefore, the residue, i.e., the polymer R2 is then asked and removed with plasma of $O_2$ gas. As a result, the film structure becomes a state shown in FIG. 2E, and the product processing process is completed. However, when the product surface needs to be prevented from coming into contact with air or moisture before the next process, the polymer R2 may be used as a protective film. In this case, the asking of the polymer R2 shown in FIG. 2E is not performed.

After the product processing process is completed, the substrate is unloaded in step S2 of FIG. 3. Next, it is determined whether the product processing process has been performed a predetermined number of substrates (step S3). When it is determined that the product processing process has not been performed the predetermined number of substrates, the process returns to step S1 and the product processing process is performed on the next substrate. On the other hand, if it is determined in step S3 that the product processing process has been performed the predetermined number of substrates, the processing is terminated. Here, it is preferred that the predetermined number of substrates is two or more in consideration of throughput. However, the predetermined number of substrates may be one. After the completion of the processing, a dry cleaning according to one embodiment (hereinafter, simply referred to as "cleaning") is performed.

In the above-described product processing process including the etching, as shown in FIGS. 2A to 2E, various types of film materials on the substrate are repeatedly etched in the chamber 11. Therefore, a deposit adhered to an inner wall of the chamber 11 includes a mixed film in which elements (Si, In, tin (Sn), and the like) for a semiconductor and a metal that form the laminated film on the substrate and elements (F, O, C, H, and the like) contained in gases used in respective processes are mixed and deposited as residues in the chamber 11. Conventionally, there has been no cleaning method capable of removing all the residues of a plurality of elements contained in such a mixed film. As a result, it is problematic in that particles are generated from the deposits adhered to the inner wall of the chamber 11 and process reproducibility cannot be obtained.

In particular, when a transparent conductive film containing indium such as the ITO film 52 is etched, indium is included in by-products. In another case, when using a halogen radical to clean silicon that is a by-product from etching the silicon-containing film, a halide of indium may be produced as a by-product. In this case, in order to volatilize and remove the halide of indium, it is necessary to increase the temperature to 600° C. or higher. Therefore, the halide of indium cannot be cleaned at an inner wall temperature of the chamber 11, which can practically only be increased up to about 150° C.

In view of the above, a method of removing these residues by wet cleaning can be considered. However, wet cleaning causes downtime during which the production is stopped, which lowers the productivity. Therefore, it is desirable to reduce the frequency of wet cleaning. Further, for example, since the boiling point of InCl (indium chloride) is 608° C., it is theoretically possible to remove the In residue with plasma of chlorine-containing gas when the entire inner wall of the chamber 11 has a high temperature of 608° C. or higher. However, it is not practical because it is industrially difficult to be implemented.

Therefore, as described below, in the cleaning method according to the embodiment, a mixed film (also referred to as a by-product or a residue) in which the metal elements of groups 12 to 16 in the chamber 11 are mixed is effectively removed. Accordingly, it is possible to suppress the generation of particles in the chamber 11 and improve the reproducibility of the process. Further, it is possible to improve the productivity by reducing the frequency of wet cleaning.

First Embodiment (Cleaning Method)

Figure 4:
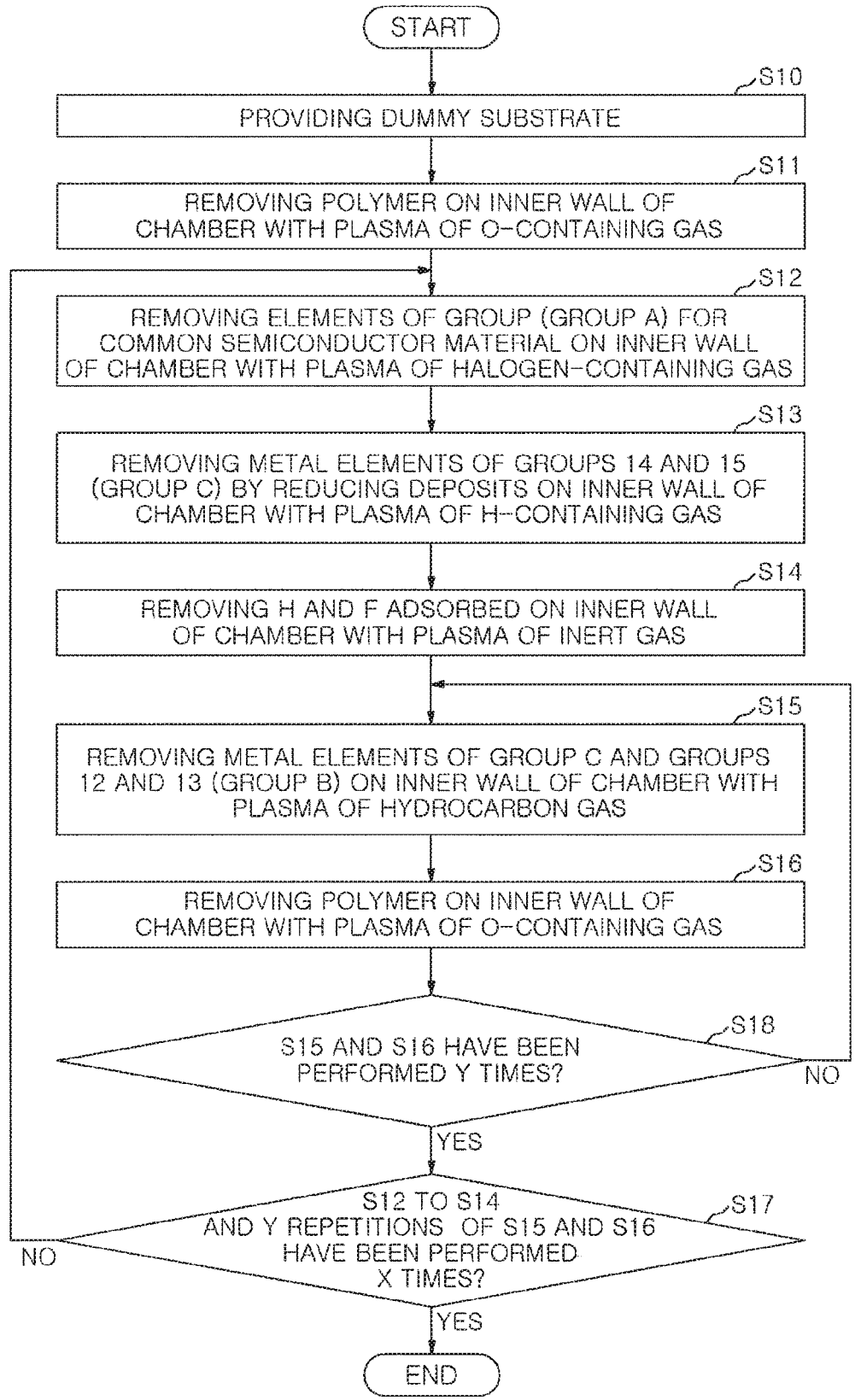
FIG. 4 is a flowchart showing a cleaning method according to a first embodiment.

First, a cleaning method according to a first embodiment, which is performed on the chamber of the plasma processing apparatus 10 after performing the product processing process, will be described with reference to FIG. 4. FIG. 4 is a flowchart showing the cleaning method according to the first embodiment.

When the processing is started, a dummy substrate is provided on the substrate support 12 of the plasma processing apparatus 10 (step S10). With this step, the substrate support 12 can be protected by the dummy substrate. However, providing the dummy substrate may be omitted.

(First Cleaning Process: Treatment with O-Containing Gas/Removal of Polymer)

Next, an O-containing gas is supplied into the chamber 11 and a radio frequency power is applied to generate plasma of the O-containing gas, so that a polymer on the inner wall of the chamber 11 is removed (step S11). The O-containing gas may be a single gas such as $O_2$, $O_3$, $CO_2$, or CO or a mixed gas thereof.

In the cleaning in step S11 (hereinafter, referred to as "first cleaning process"), a C-containing polymer residue that is mainly produced in the etching of the ITO film 52 can be removed.

The first cleaning process can be omitted because the same cleaning process is performed in step S16 in which the same O-containing gas as in step S11 is also used. Therefore, the polymer and the like can be removed in step S16. However, in order to effectively perform the next process (second cleaning process), it is preferable to perform the first cleaning process.

(Second Cleaning Process: Treatment with Halogen-Containing Gas/Removal of Group A)

Next, a halogen-containing gas is supplied into the chamber 11 and the radio frequency power is applied to generate plasma of the halogen-containing gas, so that elements of a group (hereinafter, referred to as "group A") for the common semiconductor material on the inner wall of the chamber 11 is removed (step S12). As shown in FIG. 5, the group A includes non-metallic elements of silicon (Si), germanium (Ge), boron (B), phosphorus (P), arsenic (As), nitrogen (N), carbon (C), sulfur (S), selenium (Se) and tellurium (Te).

The halogen-containing gas is at least one of an F-containing gas, a Cl-containing gas, a Br-containing gas and an I-containing gas. Examples of the F-containing gas include $NF_3$, $SF_6$, and $CF_4$. Examples of the Cl-containing gas include $Cl_2$ and $BCl_3$. HBr is an example of the Br-containing gas. HI is an example of the I-containing gas.

In the cleaning in step S12 (hereinafter, referred to as "second cleaning process"), the halides of the group A can be removed with the plasma of the halogen-containing gas. In addition, there is a possibility that the residues of the metal-containing film such as W, Ti, TiN, Ta, TaN and the like can be removed.

FIGS. 6A to 6D show boiling points of halides of the group A, a group B, and a group C according to one embodiment. All the fluorides of the group A shown in a solid line frame of FIG. 6A have boiling points lower than 0° C. That is, these fluorides are always in a gaseous state under an environment of the room temperature (15° C. to 25° C.) and the normal pressure (about 100 kPa: atmospheric pressure) and can be easily removed. Therefore, the residues of the group A can be cleaned by being fluorinated with the plasma of the F-containing gas. However, the gas used in the second cleaning process is not limited to the fluorine-containing gas and may be a chlorine (Cl) containing gas, a bromine (Br) containing gas, or an iodine (I) containing gas. In other words, the residues of the group A can be removed by producing the halides of the group A with at least one of the F-containing gas, the chlorine-containing gas, the bromine-containing gas and the iodine-containing gas.

FIGS. 6B to 6D show boiling points of chlorides of the group A obtained when each element of the group A is chlorinated with plasma of the chlorine-containing gas, boiling points of bromides of the group A when each element of the group A is brominated with plasma of the bromine-containing gas, and boiling points of iodides of the group A obtained when each element of the group A is iodinated with plasma of iodine-containing gas. The chlorides, bromides, and iodides of the group A shown in the solid line frame of FIGS. 6B to 6D have the boiling points higher than the fluorides of the group A shown in FIG. 6A. Therefore, among the halogen-containing gases, the gas that most easily removes the residues of the group A is considered to be the F-containing gas. However, the boiling points of the chlorides, bromides, and iodides of the group A are substantially lower than boiling points of chlorides, bromides, and iodides of each of the group B and the group C. Thus, the chlorides, bromides, and iodides of the group A can be removed by cleaning the inside of the chamber 11 having a predetermined vacuum state that is an environment for generating plasma. Alternatively, it may be also possible to remove the chlorides, bromides, and iodides of the group A by cleaning the inside of the chamber 11 whose inner wall temperature is controlled to be higher than the room temperature. From the above, it is found that the residues of the group A can be effectively removed with the halogen-containing gas of at least one of the fluorine-containing gas, the chlorine-containing gas, the bromine-containing gas and the iodine-containing gas.

However, when the second cleaning process is performed, the halide of indium contained in the residues is produced. Therefore, it is necessary to remove the halide of indium in following cleaning processes.

(Third Cleaning Process: Treatment with H-Containing Gas/Hydrogen Reduction+Removal of Group C)

Next, in FIG. 4, a H-containing gas is supplied into the chamber 11 and the radio frequency power is applied to generate plasma of the H-containing gas, so that the residues on the inner wall of the chamber 11 are hydrogen-reduced, thereby removing metal elements of the groups 14 and 15 (hereinafter referred to as "group C") among the residues (step S13). As shown in FIG. 5, the group C includes metal elements of germanium (Ge), tin (Sn), lead (Pb), antimony (Sb), and bismuth (Bi).

In the cleaning in step S13 (hereinafter, referred to as "third cleaning process"), the residues halogenated in step S12 are hydrogen-reduced by the plasma of the H-containing gas, so that the hydrides of the metal elements of the group C among the residues are produced. Accordingly, boiling points of the hydrides of the group C can be lowered.

FIG. 7A shows the boiling points of the hydrides of the group C according to one embodiment. The hydrides of the group C shown in the dotted-line frame mostly have boiling points below 0° C. Therefore, the hydrides of the group C are in a gaseous state at the normal temperature and the normal pressure and can be easily removed. However, although the residues of the group C can be cleaned with the plasma of the H-containing gas, it may be difficult to directly produce the hydrides of the group C. Therefore, in the cleaning method according to the present embodiment, the residues are fluorinated in the second cleaning process, and the fluorides are hydrogen-reduced in the third cleaning process. It is believed that, from the second and third cleaning processes, the hydrides of the group C can be produced. Further, since the hydrides produced at this time have a boiling point lower than 0° C., the hydrides are easily volatilized, which makes it possible to remove the group C. The third cleaning process can be omitted because the residues of the group B and the group C can be removed when the cleaning in step S15 is performed. However, in order to effectively perform the cleaning in step S15, it is preferable to perform the third cleaning process.

(Fourth Cleaning Process: Treatment with Inert Gas/Removal of Residual Gas)

Next, in FIG. 4, an inert gas is supplied into the chamber 11 and the radio frequency power is applied to generate plasma of the inert gas, so that adsorption gases such as H and F (or Cl, Br, I) that are physically adsorbed on the inner wall of the chamber 11 are removed (step S14). In the cleaning in step S14 (hereinafter referred to as "fourth cleaning process"), the adsorption gases such as H and F adsorbed on the inner wall of the chamber 11 in the steps before step S14 are removed. The adsorption gases such as H and F have a strong electric bias and, thus, are easily physically adsorbed on the inner wall of the chamber 11. Therefore, the adsorption gases such as H and F are removed in the fourth cleaning process. Examples of the inert gas include Ar and He.

Since the inert gas is also used in other cleaning processes, the adsorption gases such as H and F can be removed in those processes. Therefore, it may not be necessary to perform the fourth cleaning process. However, if a next step S15 is executed in the state where the adsorption gases such as H and F are adsorbed on the inner wall of the chamber 11, the adsorption gases and the hydrocarbon-containing gas such as $CH_4$ react with each other, so that a polymer is easily formed. In other words, the adsorption gases such as H and F remaining on the inner wall of the chamber 11 may become an obstacle in a fifth cleaning process that reduces the removal effect of the fifth cleaning process. Therefore, the fourth cleaning process is preferred to be performed without being omitted.

(Fifth Cleaning Process: Treatment with Hydrocarbon Gas/Removal of Groups B and C)

Next, a hydrocarbon gas is supplied into the chamber and the radio frequency power is applied to generate plasma of the hydrocarbon gas, so that the metal elements of the group C and metal elements of the groups 12 and 13 (hereinafter, referred to as "group B") on the inner wall of the chamber 11 (step S15) are removed. As shown in FIG. 5, the group B includes metal elements of zinc (Zn), cadmium (Cd), mercury (Hg), aluminum (Al), gallium (Ga), indium (In), and thallium (Tl). The hydrocarbon gas may be at least one of $CH_4$, $C_2H_6$, $C_3H_8$, $C_2H_4$, $C_2H_2$, and $C_2H_6$ among the alkanes represented by the general formula $C_nH_{2n+2}$ having a methyl group (—$CH_3$). The followings are other examples of the hydrocarbon gas:

Alcohol in which a hydrogen atom of hydrocarbon is replaced with a hydroxyl group (—OH) such as $CH_3OH$ (methanol), $C_2H_5OH$ (ethanol), $C_3H_8O$ (isopropyl alcohol)

Carboxylic acid represented by the general formula R—COOH (R is an alkyl group) such as $CH_3COOH$ (acetic acid) when R is a methyl group.

Ketone represented by the general formula RCOR' (R or R' is an alkyl group) such as $C_3H_6O$ (acetone) when R—R' is a methyl group.

The liquid phase under atmospheric pressure such as acetone can be used by vaporizing the liquid phase and supplying it into the chamber 11. Further, a mixture with hydrogen or a noble gas may be used.

As described above, the halides of the group B are non-volatile at relatively low temperatures and, thus, are difficult to clean. Further, the hydrides of the group B are extremely unstable. Thus, it is difficult to carry out a series of treatments for producing, volatilizing and removing hydrides of the group B.

On the other hand, in the fifth cleaning process, the methylates of the groups B and C are produced by the plasma of the hydrocarbon gas. FIG. 7B shows boiling points of the methylates of the groups B and C according to one embodiment. In FIG. 7B, the boiling point of the methylated product of indium is the highest among the boiling points of the methylates of the group B shown in a dashed-line frame and the methylates of the group C shown in a dotted-line frame. Therefore, it is found that if the methylated product of indium can be removed by volatilization, the other methylates of the groups B and C can also be removed by volatilization.

In an experiment to be described later, in the fifth cleaning process, it was found that the pressure in the chamber 11 is controlled to be in a range of 10 to 200 mT (1.33 to 26.6 Pa) or the inner wall of the chamber 11 is heated to a predetermined temperature, so that the methylated product of indium is removed by volatilization. As a result, it was found that the other methylates of the groups B and C, each of which has a boiling point lower than that of the methylated product of indium, can be volatilized and removed.

From the above, the methylates of the groups B and C can be effectively removed by the hydrocarbon gas. However, in the fifth cleaning process, when the cleaning is performed with the hydrocarbon gas such as $CH_4$ gas, the polymer remains as the residue. If the polymer is left to remain, the post-process cannot be effectively performed.

(Sixth Cleaning Process: O-Containing Gas Treatment/ Polymer Removal)

Therefore, in FIG. 4, as the next step, an O-containing gas is supplied into the chamber 11 and a radio frequency power is applied to generate the plasma of the O-containing gas, so that the polymer on the inner wall of the chamber 11 is removed (step S16). The sixth cleaning process is the same process as the first cleaning process. The sixth cleaning process is performed with the fifth cleaning process as one set after the fifth cleaning process is performed.

Thereafter, a determination process of step S18 is performed, and then it is determined whether the processes of steps S12 to S16 have been performed a predetermined number of times (X times where X is a natural number greater than or equal to 1 ($X \geq 1$)) (step S17). When it is determined in step S17 that the processes of steps S12 to S16 have been performed less than X times, the process returns to step S12 and the processes of steps S12 to S17 are performed again. When it is determined in step S17 that the processes of steps S12 to S16 have been performed X times, the present processing is terminated.

In the cleaning method according to the first embodiment, a small loop process in which the fifth and sixth cleaning processes (steps S15 and S16) are performed a predetermined number of times (Y times where Y is a natural number greater than or equal to 1 ($Y \geq 1$)) is performed in a large loop process in which the processes of steps S12 to S16 are performed X times. In other words, it is determined whether the processes of steps S15 and S16 have been performed Y times (step S18). When it is determined in step S18 that the processes of steps S15 and S16 have not been performed Y times, the process returns to step S15 and the processes of steps S15 and S16 are performed again. In other words, for example, steps S12 to S14 and the Y repetitions of steps S15 and S16 are performed in that order X times.

Accordingly, the residues of the groups B and C can also be removed with the plasma of the hydrocarbon gas. Further, the residues of the group A can be removed with the plasma of the halogen-containing gas. As a result, the mixed film containing the elements of the group A, the group B and the group C can be removed.

In the fifth cleaning process, when a large amount of residues of the elements of the groups B and C are present, a polymer generated by the plasma of the hydrocarbon gas is formed before the removal of such residues is completed, which may result in an obstruction factor in removing the residues of the elements of the groups B and C. Although this polymer is removed by the sixth cleaning process in the next step, since the elements of the groups B and C remain on the residue surface, the elements of group A are not efficiently removed even if the second cleaning process is performed later.

Therefore, the small loop process (S15 and S16) for performing the fifth and sixth cleaning processes is performed a predetermined number of times (Y times where $Y \geq 1$). As a result, the frequency of the execution of the removal process of the residues of the groups B and C can be increased, so that the group A can be efficiently removed while completely removing the residues of the elements of the groups B and C. Accordingly, the time period required for the completion of the cleaning process can be reduced.

Although the case where the fifth and sixth cleaning processes are repeated as the small loop process has been described above, the present disclosure is not limited thereto. For example, the third cleaning process, the fifth cleaning process, and the sixth cleaning process may be repeated as the small loop process. Further, the second cleaning process may be performed before or after the repetition (the small loop process) of the fifth and sixth cleaning processes. Alternatively, the second cleaning process may be performed before or after the repetition (the small loop process) of the third, fifth, and sixth cleaning processes.

Meanwhile, instead of step S17, the determination of whether or not to terminate the present processing is performed using an endpoint (EPD). For example, during the plasma generation in the fifth cleaning process (step S15) and/or during the plasma generation in the fourth cleaning process (step 14), the luminescence of the elements that are supposed to be the residues is observed and the present processing may be terminated by confirming the completion of the sufficient cleaning.

When the cleaning method is performed after the plurality of substrates W are etched, the Si-containing material, the indium-containing material, the etching gas, and the polymer generated by the etching of the ITO film 52 and the silicon oxide films 51 and 53 repeatedly adhere to the inner wall of the chamber 11 and become the residues. Therefore, the residues can be effectively removed by performing the processes of steps S12 to S17 the predetermined number of times.

(Process Condition)

The process conditions in each cleaning process described above are shown below.

The common process conditions for each cleaning process are as follows:

(Common Process Conditions)
Pressure: 10 mT to 200 mT (1.33 Pa to 26.7 Pa)
HF: 500-2000 W
LF: off
Inner wall temperature of chamber: Room temperature (15° C. to 25° C.) to 150° C.

The other process conditions for each cleaning process are as follows:
(First Cleaning Process)
Gas: $O_2$, Ar
(Second Cleaning Process)
Gas: $NF_3$, Ar
(Third Cleaning Process)
Gas: $H_2$, Ar
(Fourth Cleaning Process)
Gas: Ar
(Fifth Cleaning Process)
Gas: $CH_4$, $H_2$, Ar
(Sixth Cleaning Process)
Gas: $O_2$, Ar <Experimental Result>

Figure 8A:
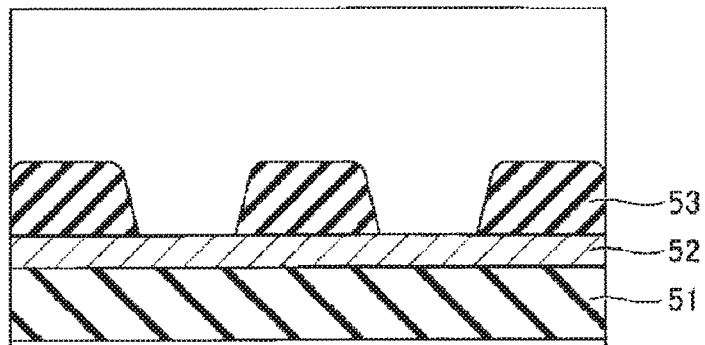
FIGS. 8A and 8B show an experimental result of performing a fifth cleaning process after an ITO film is etched according to one embodiment.
Figure 8B:
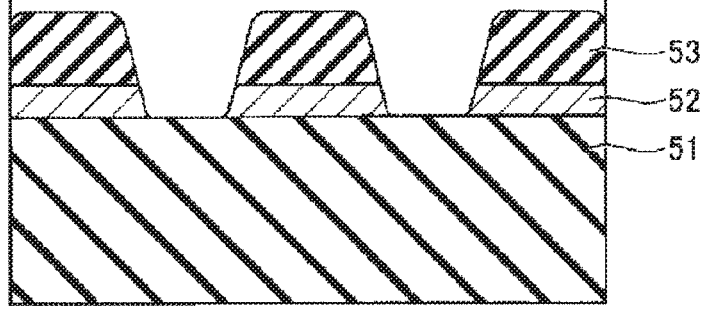

FIGS. 8A and 8B show an experimental result after the cleaning method according to the present embodiment is performed on the substrate having the ITO film 52. FIG. 8A shows a state in which a part of the silicon oxide film 53 on the ITO film 52 is etched and opened to form a mask of the ITO film 52. FIG. 8B shows the result of performing the cleaning method according to the present embodiment including the fifth cleaning process using a hydrocarbon gas and performing the etching until the underlying layer of the ITO film 52 is exposed. No bias power is applied to attract the ions generated by the plasma into the substrate while performing the cleaning method. According to the experimental result, the ITO film 52 can be removed by the etching despite the fifth cleaning process without the ion attraction. In other words, it was found that the cleaning method according to the present embodiment can remove the residue of indium adhered to the inner wall of the chamber and each part inside the chamber 11 as well as the residue of indium on the substrate.

Further, the effect of the cleaning method according to the present embodiment will be described with reference to FIGS. 9A to 9D. FIGS. 9A to 9D show the result of evaluating the surface conditions of the following substrate by a total reflection X-ray fluorescence spectroscopy (TXRF).

In the experiment, a new substrate was placed on the substrate support 12 and argon plasma was generated. As a result, the constituents of the residues adhered to the inner wall of the chamber 11 were scattered by the physical collision (sputtering) with argon ions in the plasma and were adhered to the substrate. The surface condition of the substrate was analyzed by the TXRF to evaluate the amount of residues adhered to the inner wall of the chamber 11. In order to check whether or not the cleaning method according to the present embodiment was effective, in each of a first state in which by-products were adhered to the chamber 11 by performing the product processing process of FIGS. 2A to 2E and a second state in which the first cleaning process and the second to sixth cleaning processes according to the present embodiment were repeatedly performed after the first state, the constituents of the residues adhered to the inner wall of the chamber 11 were collected by the argon plasma and the surface conditions of the substrate were analyzed by the TXRF.

Figure 9A:
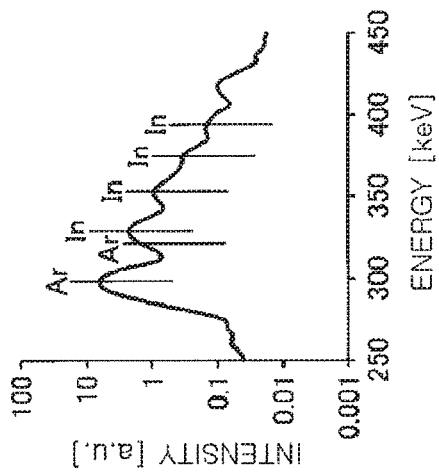
FIGS. 9A to 9D show an example of an effect of the cleaning method according to one embodiment.
Figure 9B:
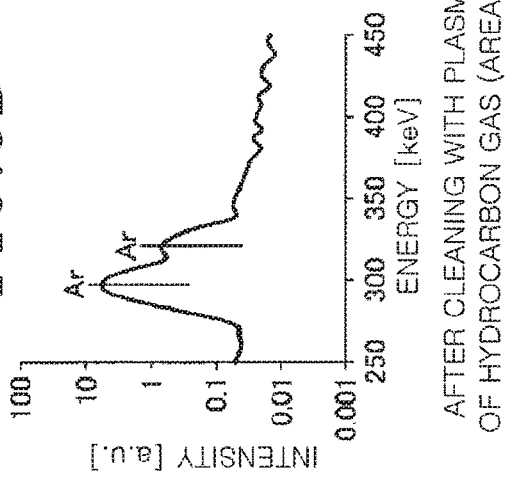
Figure 9C:
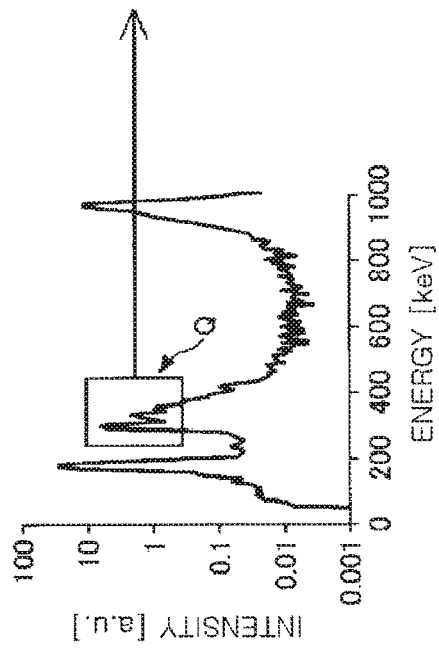
Figure 9D:
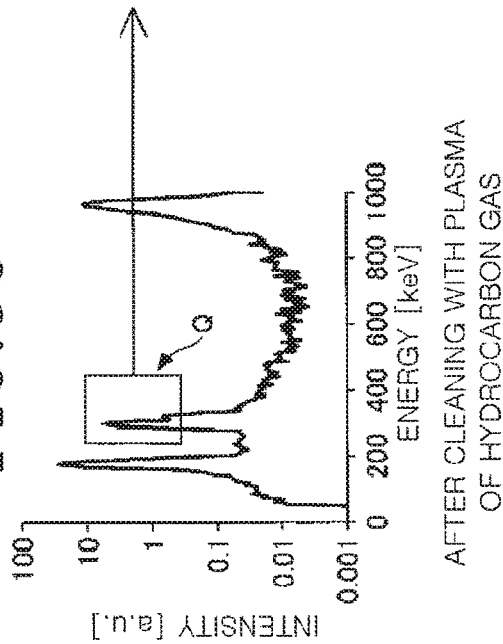

FIG. 9A shows the result of the surface condition detected by injecting X-rays onto the substrate in which the constituents of the residues were collected by the argon plasma after the product processing process of FIGS. 2A to 2E was performed. FIG. 9B is an enlarged view of an area Q shown in FIG. 9A. FIG. 9C shows the result of the surface condition detected by injecting X-rays onto the substrate in which the constituents of the residues were collected by the argon plasma after the cleaning method according to the present embodiment was performed. FIG. 9D is an enlarged view of an area Q shown in FIG. 9C.

According to the experiment, indium was detected as shown in FIG. 9B before the cleaning method according to the present embodiment is performed. On the other hand, indium was not detected as shown in FIG. 9d after the cleaning method according to the present embodiment is performed. From the above experimental results, it was proved that the indium residue adhered to the inner wall of the chamber 11 due to the product processing can be removed by the cleaning processes according to the present embodiment. In FIGS. 9B and 9D, Ar was shown in the detection result that was implanted into the substrate when the constituents of the residues were collected onto the substrate by the argon plasma.

In the conventional cleaning method, the residues containing the elements of the group A could be removed, but the residues containing the elements of the groups B and C could not be removed. Therefore, the mixed film containing the elements of the groups A, B and C could not be effectively removed.

On the other hand, as described above, according to the cleaning method according to the first embodiment, the group A can be removed with the plasma of the halogen-containing gas. On the other hand, the groups B and C cannot be removed with the plasma of the halogen-containing gas. For example, when the inside of the chamber 11 is controlled to a high temperature of about 600° C., the groups B and C can be removed theoretically with the plasma of the halogen-containing gas. However, it is not practically possible because it is industrially difficult to carry out.

Therefore, in the cleaning method according to the present embodiment, the methylates of the groups B and C are produced by the plasma of the hydrocarbon gas such as $CH_4$ gas to remove the groups B and C. By switching the gas to be used for each residue target to be removed, the mixed film containing the elements of the groups A, B and C can be effectively removed. Further, according to the cleaning method of the first embodiment, the elements of a group D such as noble gas or halogens of O, F, Cl, Br, I, He, Ne, Ar, Kr and Xe that are indicated by a chain double-dashed line in FIG. 5 can be removed together with the residues.

Meanwhile, Ge is included in both of the group A and the group C. In other words, Ge can be removed with any one of the plasma of the halogen-containing gas and the plasma of the hydrocarbon gas.

In the etching process, a radio frequency power for ion attraction (for bias voltage) (hereinafter, also referred to as "bias power") is applied to the substrate support 12 from the second radio frequency power supply 18 to attract ions in the plasma into the substrate, thereby promoting the etching. Further, in the cleaning process, the cleaning can be promoted by applying the bias power.

However, the bias power cannot be applied to the parts made of the dielectric material such as quartz or ceramic on the inner wall of the chamber 11. If the inner wall of the chamber 11 is heated to a high temperature of about 600° C., the cleaning can be promoted without applying the bias power. However, it is industrially difficult and impractical. Therefore, it is difficult to clean the inner wall of the chamber to which the bias power cannot be applied.

On the other hand, in the cleaning method according to the present embodiment, as a result of performing some of the cleaning processes without applying the bias power to the sample having the residue on the surface thereof, the indium residue can be removed as shown in FIGS. 8A and 8B. Accordingly, according to the cleaning method of the present embodiment, even the inner wall of the chamber 11 to which the bias power cannot be applied can be effectively cleaned.

Modification of First Embodiment (Cleaning Method)

Figure 10:
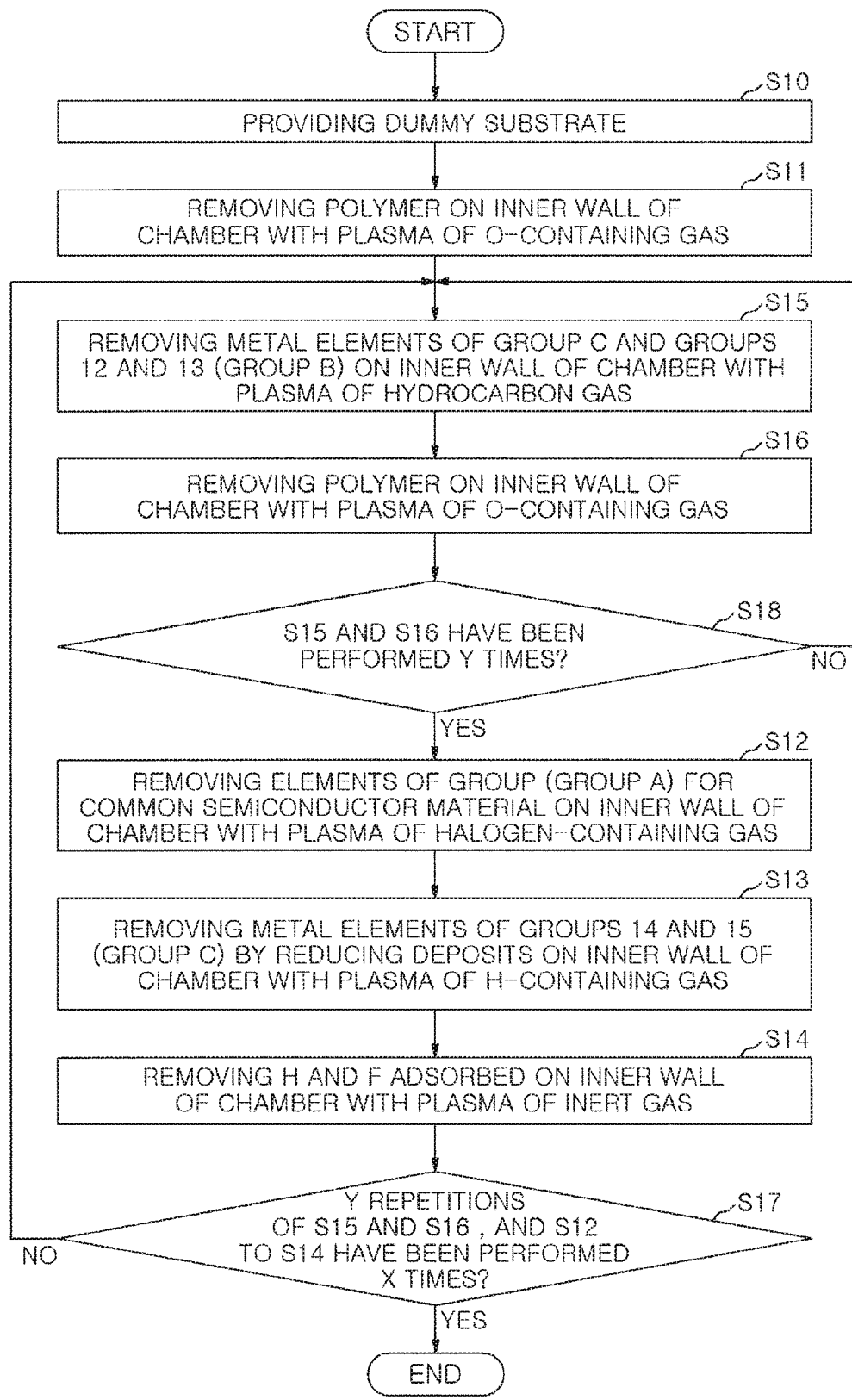
FIG. 10 is a flowchart showing a cleaning method according to a modified example of the first embodiment.

Next, a cleaning method according to a modified example of the first embodiment will be described with reference to FIG. 10. FIG. 10 is a flowchart showing the cleaning method according to the modified example of the first embodiment. In the cleaning method according to the modified example of the first embodiment, the same step numbers are given to the same steps as those in the cleaning method according to the first embodiment shown in FIG. 4. That is, in the cleaning method according to the modified example of the first embodiment, the fifth cleaning process (step S15) and the sixth cleaning process (step S16) are performed before the second to fourth cleaning processes (steps S12 to S14). Then, the processes of steps S15, S16, and S12 to S14 are performed in that order a predetermined number of times (X times). Further, the fifth cleaning process (step S15) and the sixth cleaning process (step S16) are performed in that order a predetermined number of times (Y times) as a small loop process (step S18). In other words, for example, the Y repetitions of steps S15 and S16, and steps S12 to S14 are performed in that order X times.

As described above, in the cleaning method according to the modified example of the first embodiment, the fifth and sixth cleaning processes are performed immediately after the polymer on the inner wall of the chamber 11 is removed. Thus, even if the execution order of the fifth and sixth cleaning processes is changed, the same effect as the cleaning method according to the first embodiment can be obtained.

The fifth and sixth cleaning processes are performed as one set in that order. The third cleaning process (step S13) is preferably performed after the second cleaning process (step S12). Further, the fourth cleaning process (step S14) is preferably performed after the third cleaning process (step S13).

However, the second, third, and fourth cleaning processes may be performed in any order.

In addition, the second, third, and fourth cleaning processes may or may not be performed.

Second Embodiment (Cleaning Method)

Figure 11:
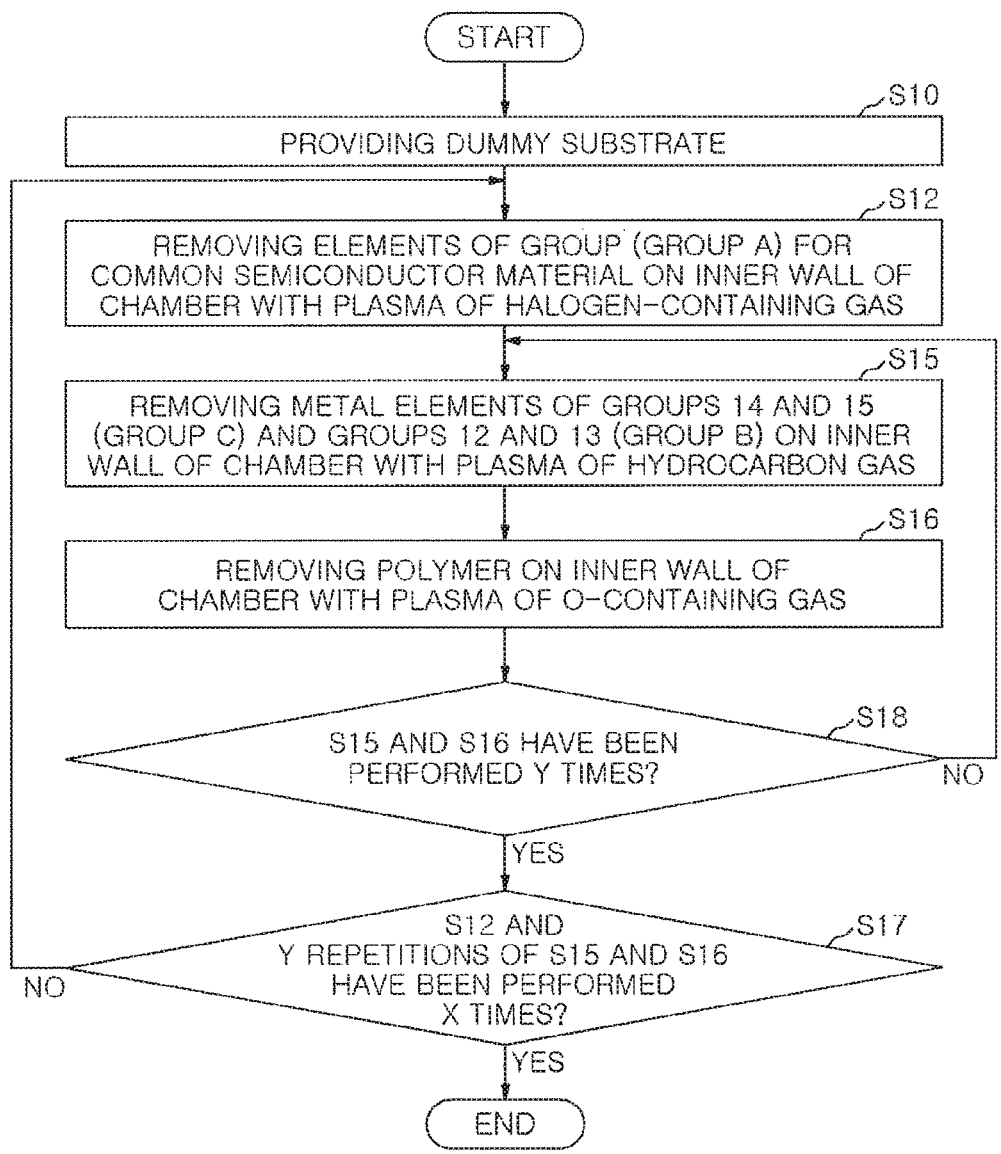
FIG. 11 is a flowchart showing a cleaning method according to a second embodiment.

Hereinafter, the cleaning method according to a second embodiment will be described with reference to FIG. 11. FIG. 11 is a flowchart showing the cleaning method according to the second embodiment. The cleaning method according to the second embodiment is a cleaning method including the minimum required cleaning processes. In the cleaning method according to the second embodiment of FIG. 11, the same step numbers are given to the same steps as those in the cleaning method according to the first embodiment shown in FIG. 4. That is, in the cleaning method according to the second embodiment of FIG. 11, the first, third, and fourth cleaning processes (steps S11, S13, and S14) of the cleaning method according to the first embodiment of FIG. 4 are not executed. In other words, the second cleaning process (step S12), the fifth cleaning process (step S15) and the sixth cleaning process (step S16) are performed in that order a predetermined number of times (X times) (step S17). Further, the fifth cleaning process (step S15) and the sixth cleaning process (step S16) are performed in that order a predetermined number of times (Y times) as a small loop process (step S18). In other words, for example, steps S12 and the Y repetitions of steps S15 and S16 are performed in that order X times.

Modification of Second Embodiment (Cleaning Method)

Figure 12:
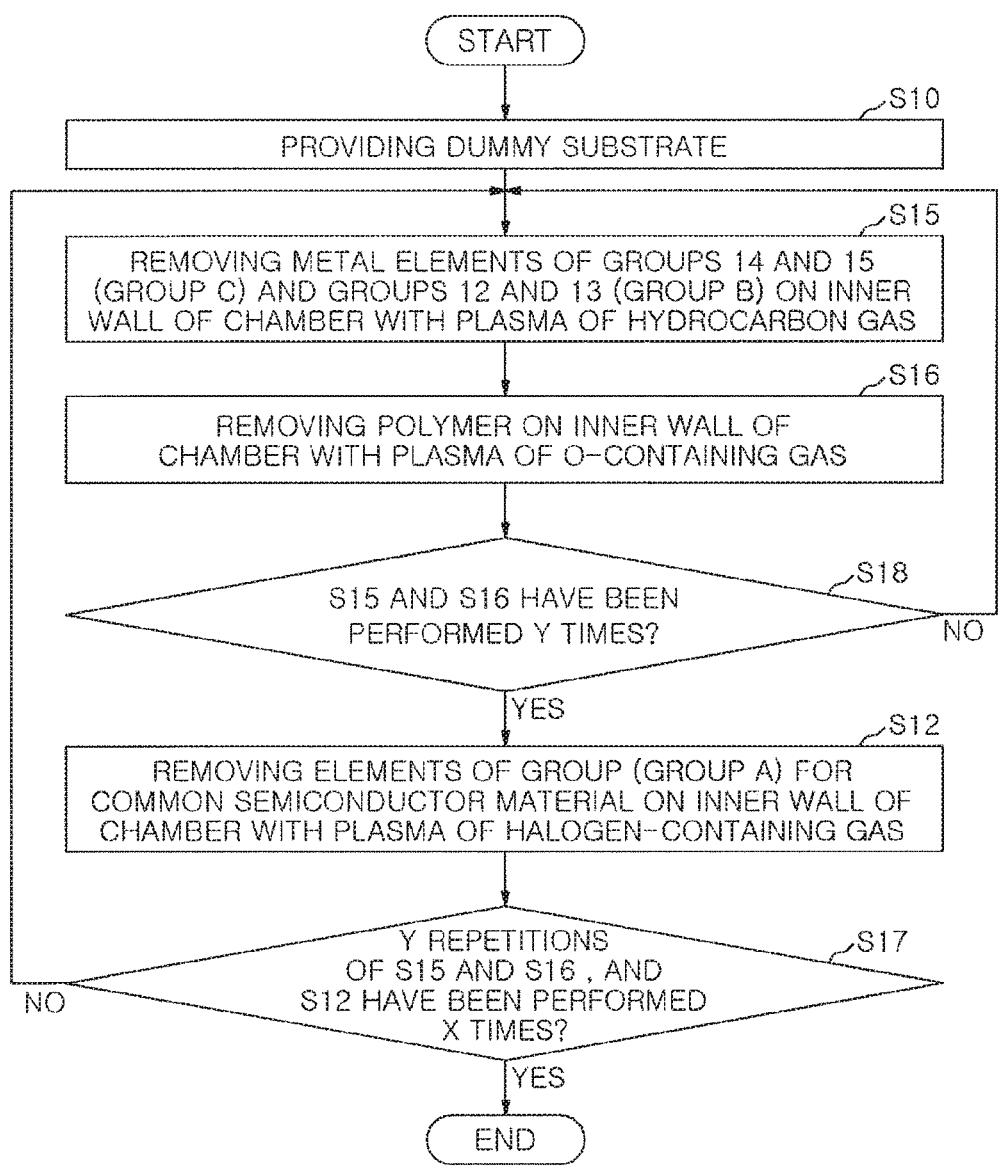
FIG. 12 is a flowchart showing a cleaning method according to a modified example of the second embodiment.

Further, a cleaning method according to a modified example of the second embodiment will be described with reference to FIG. 12. FIG. 12 is a flowchart showing the cleaning method according to the modified example of the second embodiment.

In the cleaning method of FIG. 12 according to the modified example of the second embodiment, the same step numbers are given to the same steps as those in the cleaning method according to the second embodiment shown in FIG. 11. That is, in the cleaning method according to the modified example of the second embodiment, the fifth cleaning process (step S15) and the sixth cleaning process (step S16) are performed before the second cleaning process (step S12). In other words, the fifth cleaning process (step S15), the sixth cleaning process (step S16), and the second cleaning process (step S12) are performed in that order a predetermined number of times (X times) (step S17). Further, the fifth cleaning process (step S15) and the sixth cleaning process (step S16) are performed in that order a predetermined number of times (Y times) as a small loop process (step S18). In other words, for example, the Y repetitions of steps S15 and S16, and steps S12 are performed in that order X times.

As described above, in the cleaning methods according to the second embodiment and the modified example of the second embodiment, the second, fifth, and sixth cleaning processes or the fifth, sixth, and second cleaning processes are sequentially performed as the minimum required cleaning processes. The minimum required cleaning processes are performed a predetermined number of times (X times where $X \geq 1$).

According to the second embodiment and the modified example of the second embodiment, the residues of the groups B and C can be removed with the plasma of the hydrocarbon gas. Further, the residues of the group A can be removed with the plasma of the halogen-containing gas. As a result, the mixed film containing the elements of the groups A, B and C can be removed.

Third Embodiment (Cleaning Method)

Figure 13:
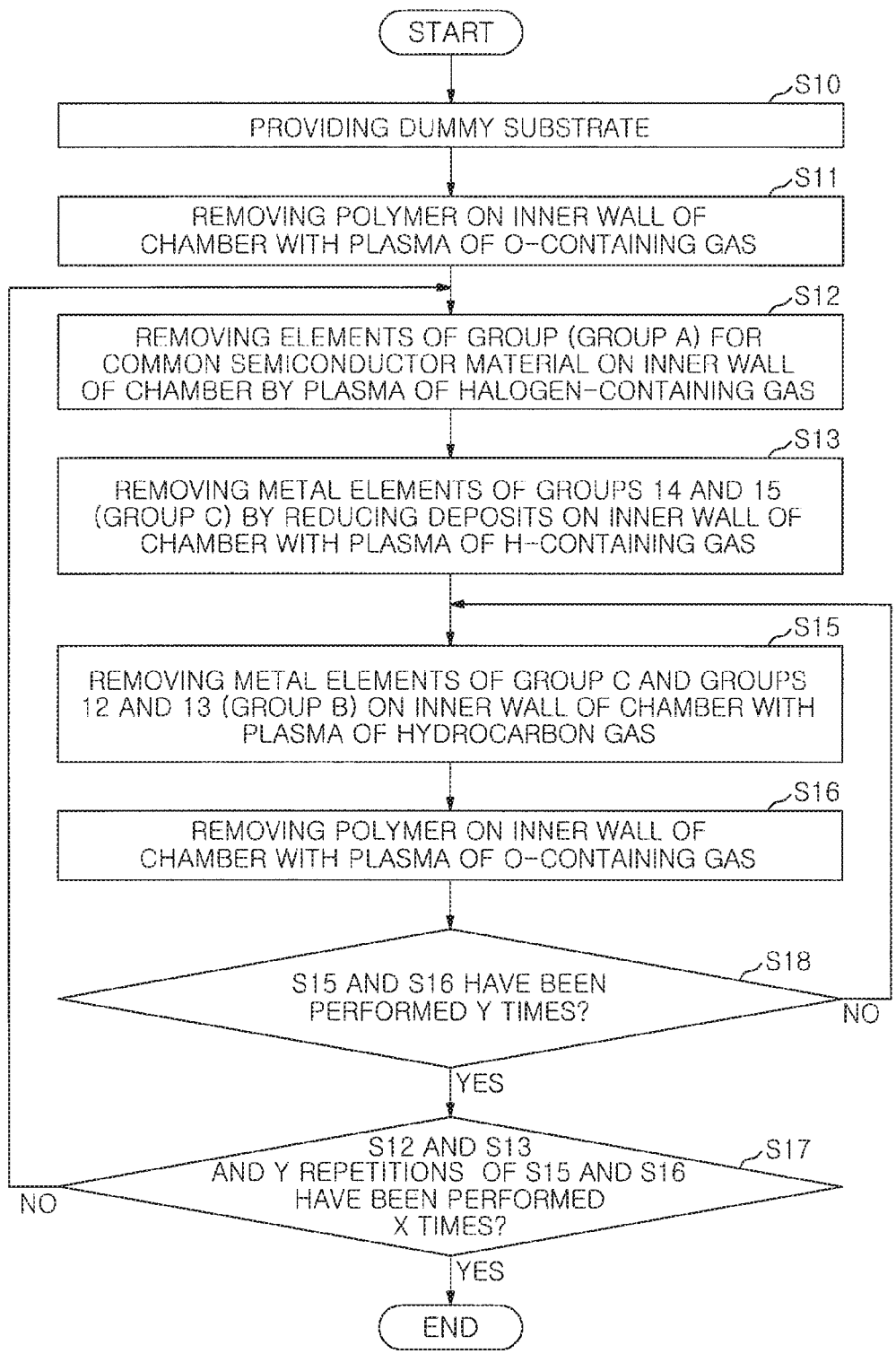
FIG. 13 is a flowchart showing a cleaning method according to a third embodiment.

Hereinafter, a cleaning method according to a third embodiment will be described with reference to FIG. 13. FIG. 13 is a flowchart showing the cleaning method according to the third embodiment. The cleaning method according to the third embodiment is a cleaning method in which the frequency of the execution of the removal process of the residues of the groups B and C is increased. In the cleaning method according to the third embodiment of FIG. 13, the same step numbers are given to the same steps as those in the cleaning method according to the first embodiment shown in FIG. 4.

In the cleaning method according to the third embodiment of FIG. 13, the fourth cleaning process (step S14) in the cleaning method according to the first embodiment of FIG. 4 is omitted.

In the cleaning method according to the third embodiment, the first cleaning process (step S11) is performed first. Next, the second cleaning process (step S12), the third cleaning process (step S13), the fifth cleaning process (step S15), and the sixth cleaning process (step S16) are performed. Further, the fifth cleaning process (step S15) and the sixth cleaning process (step S16) are performed in that order a predetermined number of times (Y times) (step S18). In other words, for example, steps S12 and S13 and the Y repetitions of steps S15 and S16 are performed in that order X times. The operation and effect of this small loop process have already been described in the first embodiment and thus will be omitted.

Modification of Third Embodiment (Cleaning method)

Figure 14:
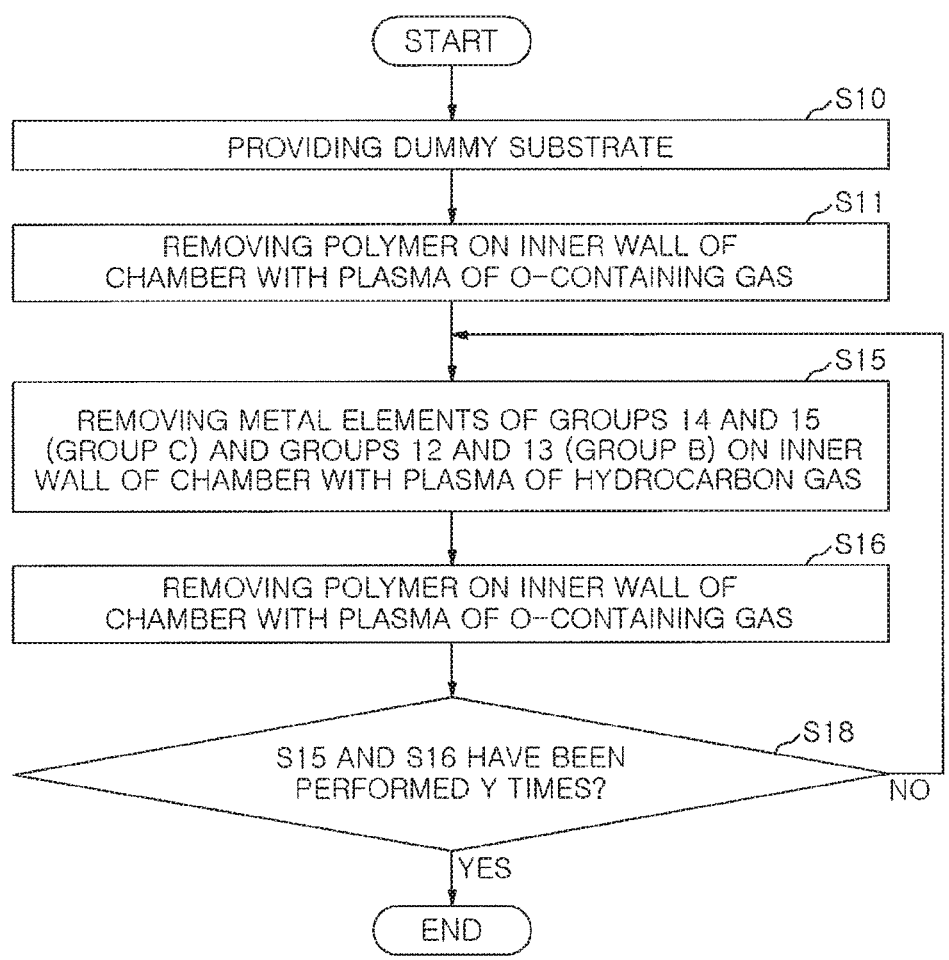
FIG. 14 is a flowchart showing a cleaning method according to a modified example of the third embodiment.

A cleaning method according to a modified example of the third embodiment will be described with reference to FIG. 14. FIG. 14 is a flowchart showing the cleaning method according to the modified example of the third embodiment. The cleaning method according to the modified example of the third embodiment is an efficient cleaning method when the residue to be cleaned does not contain the elements of the group A. In the cleaning method of FIG. 14 according to the modified example of the third embodiment, the same step numbers are given to the same steps as those in the cleaning method according to the first embodiment shown in FIG. 4. That is, in the cleaning method according to the modified example of the third embodiment, the second to fourth cleaning processes (steps S12 to S14) of the cleaning method according to the first embodiment of FIG. 4 are not executed. In other words, the first cleaning process (step S11) is performed, and then the fifth cleaning process (step S15) and the sixth cleaning process (step S16) are performed in that order a predetermined number of times (Y times) (step S18). In the modified example, since the second to fourth cleaning processes (steps S12 to S14) are not executed, step S17 and the large loop process are omitted.

According to the modified example of the third embodiment, since the second cleaning process is not performed, the residues of the group A cannot be removed, but the residues of the groups B and C can be removed with the plasma of the hydrocarbon gas by performing the fifth cleaning process. Further, the first cleaning step (step S11) may be omitted.

Fourth Embodiment (Cleaning Method)

Figure 15:
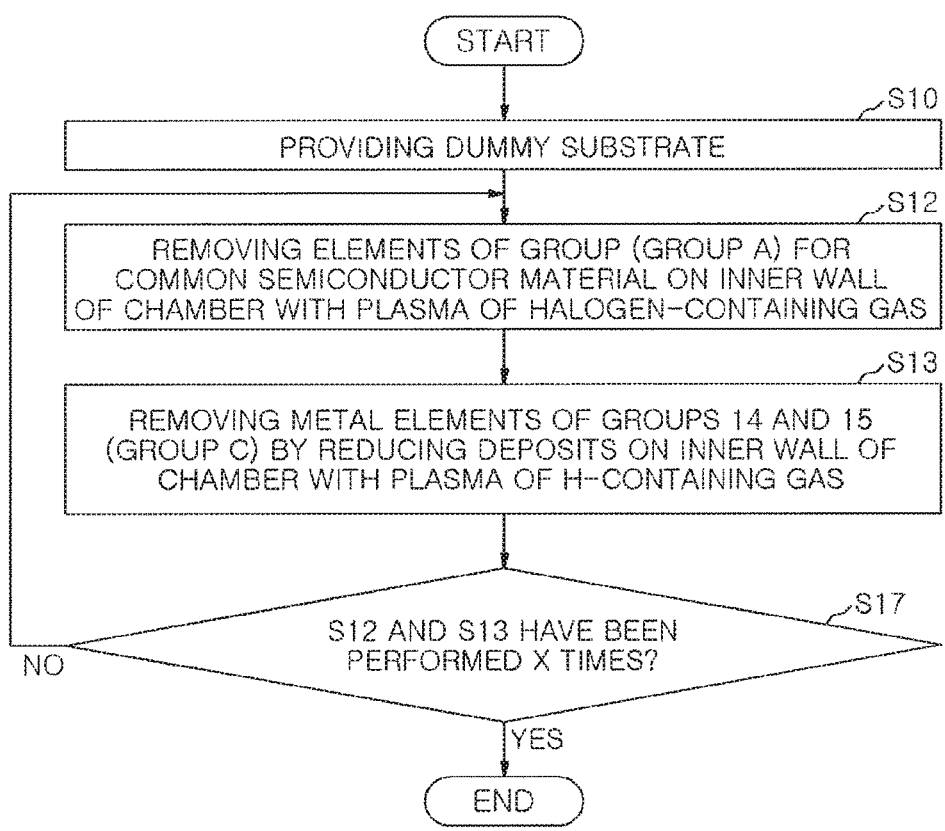
FIG. 15 is a flowchart showing a cleaning method according to a fourth embodiment.

Next, the cleaning method according to a fourth embodiment will be described with reference to FIG. 15. FIG. 15 is a flowchart showing the cleaning method according to the fourth embodiment. The cleaning method according to the fourth embodiment is an efficient cleaning method when the residue to be cleaned does not contain the elements of the group B. In the cleaning method according to the fourth embodiment of FIG. 15, the same step numbers are given to the same steps as those in the cleaning method according to the first embodiment shown in FIG. 4. That is, in the cleaning method according to the fourth embodiment of FIG. 15, the first cleaning process (step S11) and the fourth to sixth cleaning processes (steps S14 to S16) in the cleaning method according to the first embodiment of FIG. 4 are not performed. In other words, the second cleaning process (step S12) and the third cleaning process (step S13) are performed in that order a predetermined number of times (X times) (step S17).

According to the fourth embodiment, since the fifth cleaning process is not performed, the residues of the group B cannot be removed, but the residues of the groups A and C can be removed by performing the second and third cleaning processes.

As described above, according to the cleaning method and the plasma processing apparatus of the present embodiments, the residues of the groups A, B and C in the chamber can be effectively removed by the respective cleaning processes.

The cleaning methods according to each of the embodiments and the modifications described above are not limited to be used for cleaning the chamber 11 of the plasma processing apparatus 10 shown in FIG. 1. For example, the above-described cleaning methods can be used for cleaning a semiconductor exposure apparatus having an EUV light source. For example, the cleaning method according to the fourth embodiment is suitable for cleaning the semiconductor exposure apparatus. The semiconductor exposure apparatus is an example of a plasma processing apparatus.

In the semiconductor exposure apparatus, a tin-containing gas is irradiated with a laser to generate plasma of the tin-containing gas, and X-rays (UV light) of 13.5 nm are emitted from the generated plasma to expose a resist or the like. At the time of exposure, a tin residue is deposited in the chamber 11 of the semiconductor exposure apparatus. Therefore, the tin residue contained in the group C is removed by the cleaning methods according to the first to fourth embodiments and the modifications. As described above, by selecting one of the cleaning methods according to the above-described embodiments and their modifications depending on the type of the residues, it is possible to clean at least one of the elements included in the groups A, B and C and also possible to reduce the cleaning time.

The cleaning method and the plasma processing apparatus according to the presently disclosed embodiments are considered in all respects to be illustrative and are not restrictive. The above-described embodiments can be changed and modified in various forms without departing from the scope of the appended claims and the gist thereof. Further, the contents described in the above embodiments can be implemented in other embodiments without contradicting each other and can be combined without contradicting each other.

The plasma processing apparatus 10 of the present disclosure can be applied to any type of apparatus using atomic layer deposition (ALD), capacitively coupled plasma (CCP), inductively coupled plasma (ICP), a radial line slot antenna (RLSA), electron cyclotron resonance (ECR) plasma, or helicon wave plasma (HWP).

Further, the plasma processing apparatus is not limited to the etching apparatus as long as the apparatus can perform a predetermined process (e.g., film formation, etching, or the like) on the substrate using plasma. For example, the plasma processing apparatus may be a film forming apparatus, an asking apparatus, a doping apparatus, or the like. Further, for example, the plasma processing apparatus may be an ITO film forming apparatus using a sputtering method or a metal-containing film forming apparatus using a MOCVD method.

The plasma processing apparatus may be a plasma ALD apparatus or a plasma CVD apparatus. Further, remote plasma may be used as the plasma used in the cleaning methods according to the above-described embodiments and their modifications.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A cleaning method comprising:
removing a first residue in a chamber with a plasma of a halogen-containing gas, wherein the first residue comprises one or more elements from the group consisting of silicon, germanium, boron, phosphorus, arsenic, nitrogen, carbon, sulfur, selenium, and tellurium;
removing residues of metal elements of groups 12 and 13 and residues of metal elements of groups 14 and 15 in the chamber with a plasma of a hydrocarbon-containing gas; and
removing a C-containing material in the chamber with a plasma of an O-containing gas, wherein said removing with the plasma of the halogen-containing gas, said removing with the plasma of the hydrocarbon-containing gas, and said removing with the plasma of the O-containing gas are performed in that order X times, where X is a natural number greater than or equal to 1, or said removing with the plasma of the hydrocarbon-containing gas, said removing with the plasma of the O-containing gas, and said removing with the plasma of the halogen-containing gas are performed in that order X times.

2. The cleaning method of claim 1 further comprising: removing residues of the metal elements of the groups 14 and 15 with a plasma of an H-containing gas after said removing with the plasma of the halogen-containing gas.

3. The cleaning method of claim 2 further comprising: removing H, and at least one of F, Cl, Br, and I in the chamber with a plasma of an inert gas after said removing with the plasma of the halogen-containing gas or said removing with the plasma of the H-containing gas.

4. The cleaning method of claim 1, wherein said removing with the plasma of the hydrocarbon-containing gas and said removing with the plasma of the O-containing gas are performed in that order Y times, wherein Y is a natural number greater than or equal to 1, such that said removing with the plasma of the halogen-containing gas and the Y performances of said removing with the plasma of the hydrocarbon-containing gas and said removing with the plasma of the O-containing gas are performed in that order X times, or the Y performances of said removing with the plasma of the hydrocarbon-containing gas and said removing with the plasma of the O-containing gas, and said removing with the plasma of the halogen-containing gas are performed in that order X times.

5. The cleaning method of claim 2, wherein said removing with the plasma of the hydrocarbon-containing gas and said removing with the plasma of the O-containing gas are performed in that order Y times, where Y is a natural number greater than or equal to 1, such that said removing with the plasma of the halogen-containing gas, said removing with the plasma of the H-containing gas, and said Y performances of said removing with the plasma of the hydrocarbon-containing gas and said removing with the plasma of the O-containing gas are performed in that order X times, or the Y performances of said removing with the plasma of the hydrocarbon-containing gas and said removing with the plasma of the O-containing gas, said removing with the plasma of the halogen-containing gas, and said removing with the plasma of the H-containing gas are performed in that order X times.

6. A cleaning method comprising:
removing residues of metal elements of groups 12 and 13 and residues of metal elements of groups 14 and 15 in a chamber with a plasma of a hydrocarbon-containing gas, wherein each of the residues is a residue on a surface of a component of the chamber, and wherein the chamber is a chamber configured for plasma-processing substrates that can be selectively moved into and out of the chamber; and removing a C-containing material in the chamber with a plasma of an O-containing gas, wherein said removing with the plasma of the hydrocarbon-containing gas and said removing with the plasma of the O-containing gas are performed in that order X times, where X is a natural number greater than or equal to 1.

7. The cleaning method of claim 1, wherein the hydrocarbon-containing gas is at least one of $CH_4$, $C_3H_8$, $C_2H_4$, $C_2H_2$, and $C_2H_6$.

8. The cleaning method of claim 6, wherein the hydrocarbon-containing gas is at least one of $CH_4$, $C_3H_8$, $C_2H_4$, $C_2H_2$, and $C_2H_6$.

9. The cleaning method of claim 1, wherein the halogen-containing gas is at least one of $NF_3$, $SF_6$, $CF_4$, $Cl_2$, $BCl_3$, HBr and HI.

* * * * *